United States Patent
Brown et al.

[11] Patent Number: 5,395,643
[45] Date of Patent: Mar. 7, 1995

[54] METHOD OF AND APPARATUS FOR DEPOSITING SOLDER ON A PRINTED CIRCUIT BOARD

[75] Inventors: John Brown, Skelmorlie; Kenneth Murray, Inverkip; James McNee, Greenock; Brian Robertson, Gourock, all of Scotland

[73] Assignee: International Business Machines Corporation, Armonk, N.Y.

[21] Appl. No.: 190,700

[22] Filed: Feb. 2, 1994

Related U.S. Application Data

[63] Continuation of Ser. No. 945,473, Sep. 16, 1992, abandoned.

[30] Foreign Application Priority Data

Sep. 18, 1991 [GB] United Kingdom ................ 9119960

[51] Int. Cl.⁶ ............................................. B05D 1/00
[52] U.S. Cl. ..................................... 427/96; 427/282; 118/210; 118/213; 118/239
[58] Field of Search .................. 427/96, 282; 118/210, 118/213, 239

[56] References Cited

U.S. PATENT DOCUMENTS

| | | | |
|---|---|---|---|
| 4,515,297 | 5/1985 | Schoenthaler | 427/96 |
| 4,604,966 | 8/1986 | Kohn | 118/213 |
| 4,622,239 | 11/1986 | Schoenthafer | 427/96 |
| 4,649,817 | 3/1987 | Smith | 101/128.4 |
| 4,720,402 | 1/1988 | Wojcik | 427/96 |
| 4,722,470 | 2/1988 | Johary | 118/255 |
| 4,872,261 | 10/1989 | Sanyal et al. | 29/840 |
| 4,898,117 | 2/1990 | Ledermann | 118/74 |
| 4,938,994 | 7/1990 | Choinski | 427/96 |
| 5,104,689 | 4/1992 | Hayden | 427/96 |

OTHER PUBLICATIONS

IBM TDB, vol. 33, No. 12, May 1991, p. 144, "Via Fill with Molten Solder".

*Primary Examiner*—Shrive Beck
*Assistant Examiner*—Vi Duong Dang
*Attorney, Agent, or Firm*—Mark E. McBurney

[57] ABSTRACT

Solder is deposited on a printed circuit board by melting the solder in a container. The container has a slot for passage of solder, therethrough and control means actuable to alternately allow and prevent passage of solder through the slot. The slot is placed in contact with a stencil and the control means is actuated to allow passage of solder through the slot. The stencil is moved relative to the container in a direction transverse of the slot to deposit solder on the printed circuit board via the stencil.

18 Claims, 3 Drawing Sheets

METHOD OF AND APPARATUS FOR DEPOSITING SOLDER ON A PRINTED CIRCUIT BOARD

This is a continuation of application Ser. No. 07/945,473, filed Sep. 16, 1992, abandoned.

BACKGROUND OF THE INVENTION

The present invention relates to a method of and apparatus for depositing molten solder on a printed circuit board (PCB).

Conventionally, solder for bonding surface mount technology (SMT) devices to a PCB is deposited on the PCB in the form of a paste. The paste is usually deposited via a stencil of an area commensurate with the PCB. Apertures are formed in the stencil at points corresponding to solder pads on the PCB. The paste is initially placed on the stencil surface remote from the PCB and forced through the apertures onto the PCB by a squeegee. The PCB is passed through a furnace in which the solder paste melts, wets the pads and the leads of devices are placed on the PCB. The solder then solidifies and bonds the devices to the pads. In general, acceptable solder joints are produced if the deposited paste exceeds a minimum height of about 0.2 mm. In practice, if the solder pads vary in size (typically from 0.25 mm height upwards), the conventional stencil technique is usually augmented by additional solder deposition processes to ensure that acceptable amounts of solder are deposited on all of the solder pads. However, these additional processes introduce unwanted manufacturing delays.

IBM Technical Disclosure Bulletin Vol. 33 No. 12, describes a tool for depositing molten solder on a printed circuit board. The tool comprises a container for carrying molten solder. The container has a faceplate perforated by cylindrical holes and a piston for regulating the flow of solder through the holes. The holes are arranged to match the pad pattern of a device site on a PCB. In use, the tool is positioned over a receiving device site and the solder is urged onto the site by the piston. The tool is then moved to another receiving device site (pad) on the PCB. Because the solder is molten rather than in paste form, it can be dispensed through smaller apertures and onto smaller pads. Because the tool must be moved from one device site to another, the molten solder can be dragged across the PCB thereby producing unwanted solder bridges between adjacent pads.

SUMMARY OF THE INVENTION

In accordance with the present invention, there is now provided a method of depositing solder on a printed circuit board, which includes melting solder in a container having a slot therein for passage of solder and control means actuable to control passage of solder through the slot. The slot is then placed in contact with a stencil which is being formed from a solder resistant material. The control means are then actuated to allow passage of solder through the slot. The stencil and the printed circuit board are then moved relative to the container in a direction transverse of the slot to deposit solder on the printed circuit board via the stencil.

Because the stencil is moved past the container, the molten solder can be held substantially immobile. This advantageously reduces the potential for solder to be dragged across the PCB and thus for producing unwanted solder bridges between adjacent pads.

The stencil may be conveniently mounted on a frame reciprocable about the container. Alternatively, the stencil may be mounted on an endless flexible web, the web being rotatable in a closed path around the container. Printed circuit boards can thus be presented to the stencil via a conveyor belt to increase manufacturing throughput.

The stencil is preferably perforated by apertures of substantially equal size. This advantageously improves regulation of the solder flow through the stencil in such a manner that sufficient solder can be deposited on a PCB in one pass.

In a preferred embodiment of the present invention, there is provided apparatus for depositing solder on a printed circuit board which includes a container with the slot therein for passage of solder therethrough. A heater for melting solder is contained therein, and control means actuable to control passage of solder through the slot is also included. A stencil is provided that is formed from a solder resistant material. A support is also used for placing the slot in contact with the stencil, the support being in contact with the stencil for movement relative to the container in a direction transverse of the slot. Thus, when the control means is actuated to allow passage of solder through the slot and the stencil and the printed circuit board are moved relative to the container solder is deposited on the printed circuit board via the stencil.

BRIEF DESCRIPTION OF THE DRAWINGS

In accordance with the previous summary, objects features and advantages of the present invention will become apparent to one skilled in the art from the subsequent description and the appended claims taken in conjunction with the accompanying drawings.

Preferred embodiments of the present invention will now be described with reference to the accompanying drawings in which.

DETAILED DESCRIPTION OF THE PREFERRED EMBODIMENTS

Figure 1:
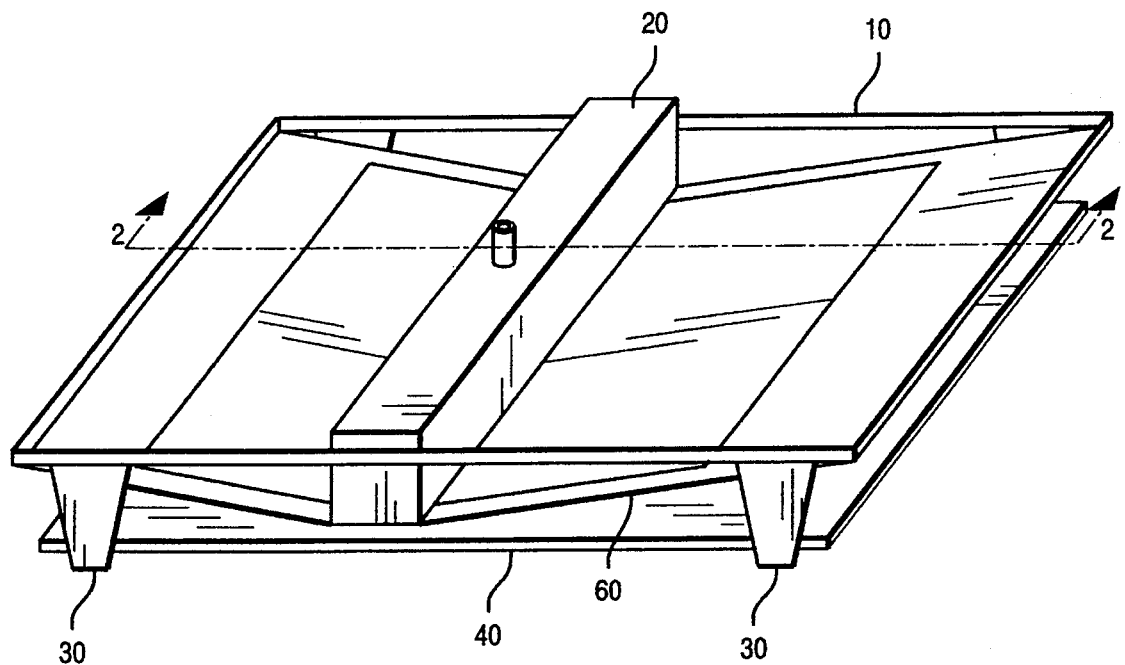
FIG. 1 is a simplified isometric view of an embodiment of solder deposition apparatus of the present invention.
Figure 2:
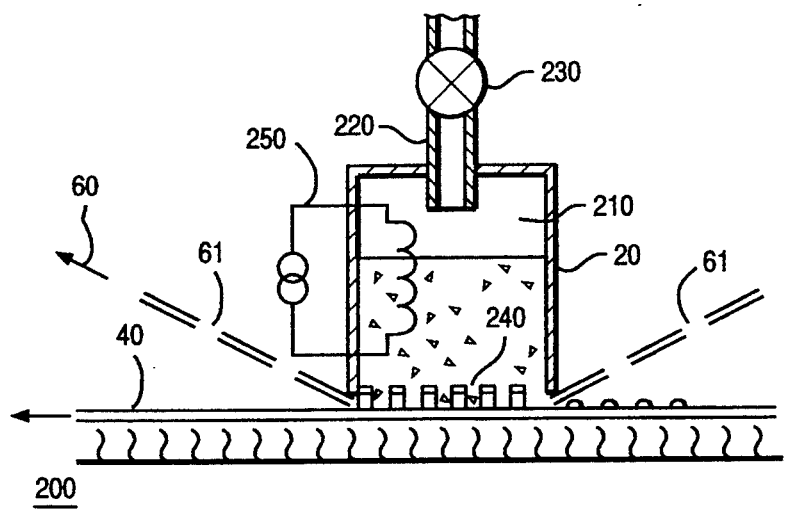
FIG. 2 is a cross sectional view of the apparatus when viewed in the direction of the arrows from the plane containing line AA.

Referring first to FIGS. 1 and 2, an embodiment of solder deposition apparatus of the present invention comprises a frame 10 mounted for reciprocal movement relative to a stationary solder receptacle 20 hereinafter referred to as a well. The frame 10 comprises a lower portion 30, such as a holding market, or the like, for releasably supporting a PCB 40 onto which solder is to be deposited and an upper portion 50 for releasably supporting a flexible stencil 60 above the PCB 40 in such a manner that apertures 61 formed in the stencil 60 register with solder pads on PCB 40. A back heater 200 (FIG. 2) is provided in the lower portion 30 of the frame 10 to heat the PCB 40. The solder well 20 is a reservoir in the form of an inverted channel 210 extending from one side of the frame 10 to the other. The channel 210 is closed at each end and open along its length to provide a downwardly pointing slot 240 traversing the frame 10 from one side to the other. An opening 220 in the top of the channel 210 is connected to a valve 230 for controlling the air pressure within the channel 210. A heater 250 is provided in the well 20 to heat the interior of the channel 210.

Figure 3:
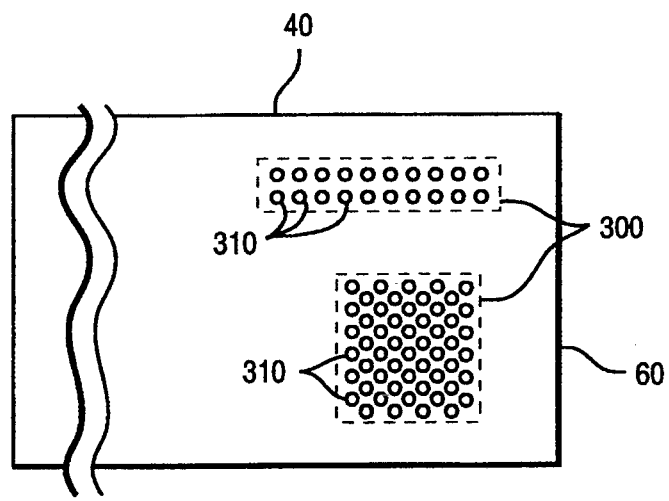
FIG. 3 is a plan view of a stencil for apparatus of the present invention.

Referring now to FIG. 3, the areas 300 of the PCB 40 on which solder is to be deposited are defined in the stencil 60 by arrays of holes 310 of substantially the same size and shape as each other. In preferred embodiments of the present invention, the holes are between 0.1 mm and 0.2 mm in diameter. The stencil 60 is formed from a material with a surface energy that is sufficiently low such that surface of the stencil 60 will be solder resistant, i.e. non-wettable surface. Suitable materials include aluminum, titanium, stainless steel, or high temperature polyimide plastics. It will be appreciated that if solder is permitted to wet the surface of the stencil 60, the risk of the apparatus clogging is increased. The stencil 60 is preferably formed from titanium.

In use, the stencil 60 is mounted in the upper portion 50 of the frame 10 in contact with the slot 240 of the well 20. The PCB 40 on which solder is to be deposited is mounted in the lower portion 30. A mechanical bias (not shown), e.g., the weight of solder well 20 urges the well towards the PCB 40 to tension the stencil 60 against the slot 240. Solder is heated in the channel 210 by the heater 250 until molten. The molten solder is retained in the channel by closing the valve 230. Initially, the frame 10 is located with its right hand edge adjacent the well 20. The frame 10 is then moved from right to left until its left hand edge is adjacent the well 20. Simultaneously, as the stencil 60 is drawn past the slot 240, the valve 230 is opened by a controlled amount to regulate the flow of solder under gravity through the holes 310 in the stencil 60 onto the PCB 40. When the left hand edge of the frame 10 reaches the well 20, the valve 230 is closed and the PCB 40 is removed for further processing. Solder can then be deposited on another PCB as the frame 40 is returned to its initial position with its right hand edge adjacent then well 20.

Figure 4A:
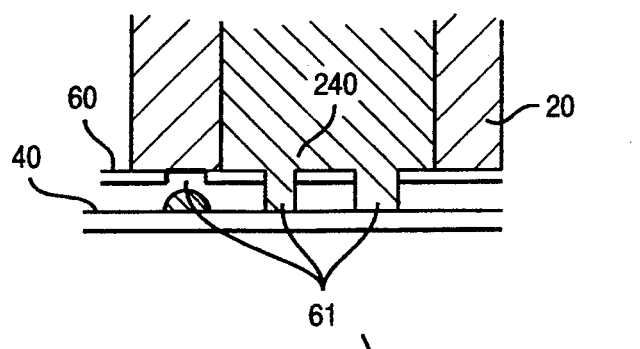
FIGS. 4a and 4b are magnified views of the cross section shown in FIG. 2 of apparatus in operation.
Figure 4B:
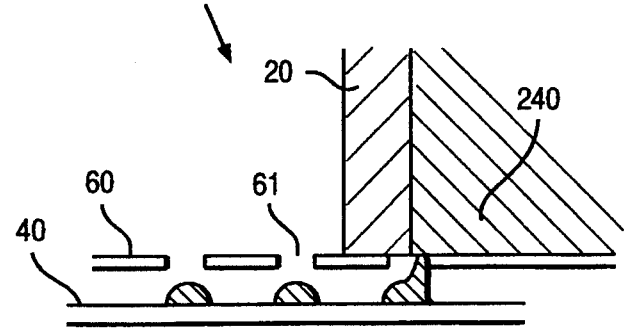

Referring now to FIGS. 4a and 4b, as each aperture 61 is drawn past the slot 240, the trailing edge of the well 20 shears off the solder deposit. Because the holes 310 are substantially the same size, the flow of solder onto the PCB 40 can be controlled by the valve 230 independently of the solder pad size. The PCB 40 is back heated by the back heater 200 to ensure that the solder wets the solder pads.

Figure 5:
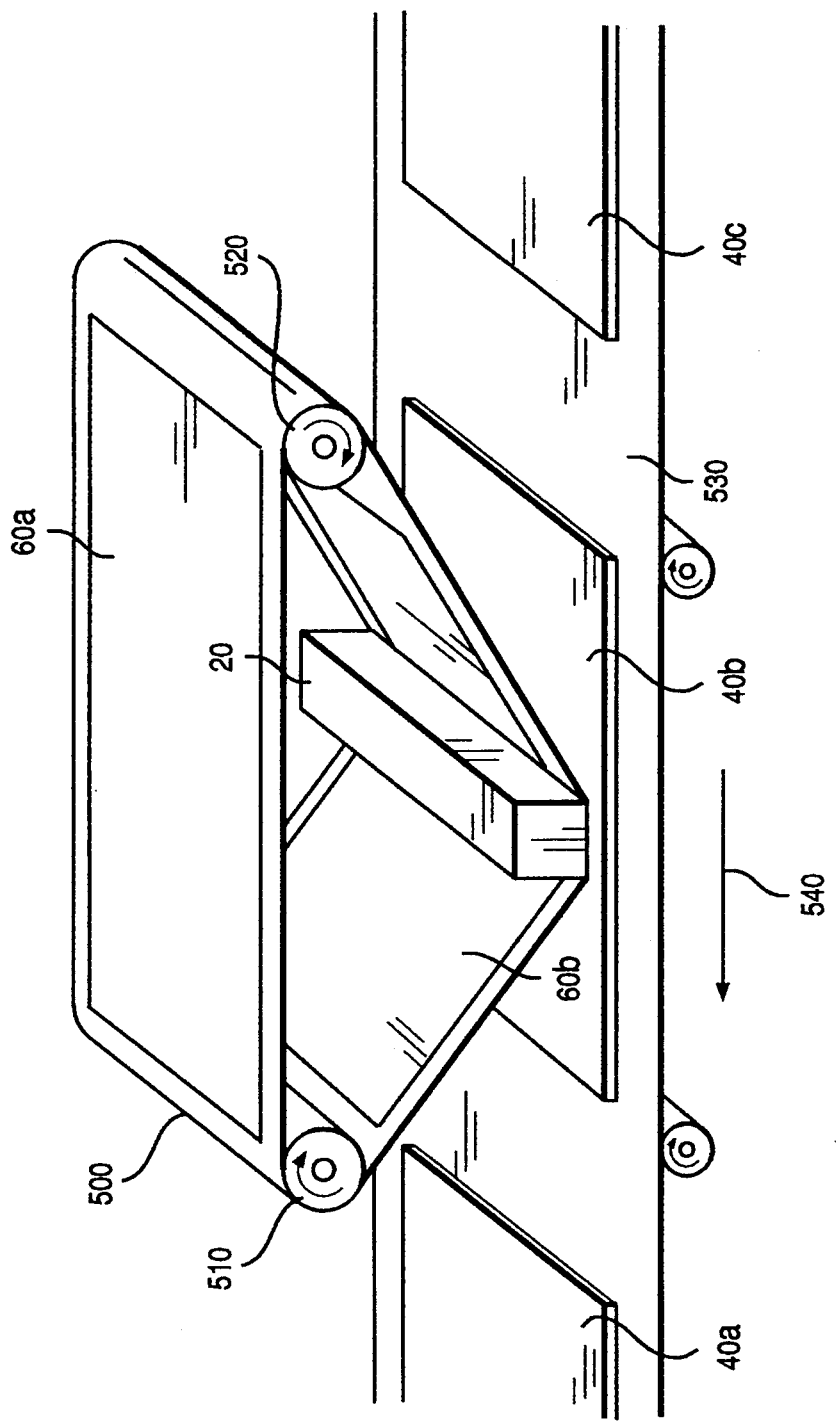
FIG. 5 is a simplified isometric view of another embodiment of apparatus of the present invention.

Referring now to FIG. 5, in another embodiment of the present invention, there are two stencils 60a, 60b releasably mounted on an endless flexible web 500. The web 500 passes over a pair of motorized guide rollers 510, 520 supported above a conveyor belt 530. The well 20 is biased towards the conveyor belt 530 by gravity or other mechanical means (not shown) to tension the web 500 against the slot 240.

In operation, the PCBs 40a, 40b, 40c, onto which solder is to be deposited, are placed at regular intervals along the conveyor belt 530. Arrow 540 indicates the direction of conveyor belt travel. The web 500 is rotated by the rollers 510, 520 in synchronization with the PCBs 40a, 40b, 40c on the conveyor belt 530 in such a manner that the stencils 60a, 60b are alternately presented to successive PCBs 40a, 40b, 40c. The cooperation of the well 20 and the stencils 60a, 60b in depositing solder onto the PCBs 40a, 40b, 40c is the same as the previously described embodiment. However, it will be appreciated that this embodiment may be more useful in a production line environment because the PCBs 40a, 40b, 40c travel past the well in one direction only. Furthermore, it will be appreciated that this embodiment may operate at the same speed as the previous embodiment but with PCBs being supplied in one direction instead of two directions.

In the embodiment of the invention hereinbefore described with reference to FIG. 5, the web 500 carries two stencils 60a, 60b. However, in other embodiments of the present invention, the web 500 may carry one, three or more stencils. Furthermore, in other embodiments of the invention the valve 230 may be replaced by a piston, corrected to a source of pressurized fluid, such as air, or the like for urging the solder through the slot 240.

Although certain preferred embodiments have been shown and described, it should be understood that many changes and modifications can be made therein without departing from the scope of the appended claims.

What is claimed is:

1. A method of depositing plural distinct solder patterns on a plurality of printed circuit boards, comprising the steps of:

storing solder in a container having at least one slot therein to allow passage of the solder therethrough;

placing the slot in contact with at least a first and second stencil each mounted on an endless flexible web including solder resistant material, said at least first and second stencils having a distinct pattern;

selectively controlling passage of solder through the slot; and continuously moving the at least first and second stencils and at least a first and second corresponding printed circuit board, in aligned relation, relative to the container in a direction transverse to the slot to deposit said solder on the first printed circuit board via the first stencil and the second printed circuit board via the second stencil;

wherein said plural distinct solder patterns are continuously formed on said plurality of printed circuit boards.

2. A method as claimed in claim 1, further comprising the steps of:

mounting the stencil on an endless flexible web; and rotating the web in a closed path around the container.

3. A method as claimed in claim 2, wherein the step of mounting comprises mounting a plurality of stencils on the web.

4. A method as claimed in claim 1, wherein the step of moving comprises the steps of:

mounting the stencil on a frame; and reciprocatingly moving the stencil and printed circuit board with respect to the container and in a direction transverse to said slot.

5. A method as claimed in claim 4, further comprising the step of providing the stencil with apertures of substantially equal size.

6. A method as claimed in claim 5, further comprising providing the at least one slot on the container in a downwardly pointing direction.

7. An apparatus for depositing plural distinct solder patterns on a plurality of printed circuit boards, comprising:
- means for storing solder in a container having at least one slot therein to allow passage of the solder therethrough;
- means for biasing the slot to contact at least a first and second stencil each mounted on an endless flexible web including plurality of stencils including a solder resistant material, said at least first and second stencils having a distinct pattern;
- means for selectively controlling passage of solder through the slot; and
- means for continuously moving the at least first and second stencils and at least a first and second corresponding printed circuit board, in aligned relation, relative to the container in a direction transverse to the slot to deposit said solder on the first printed circuit board via the first stencil and the second printed circuit board via the second stencil;
- wherein said plural distinct solder patterns are continuously formed on said plurality of printed circuit boards.

8. An apparatus as claimed in claim 7, wherein the stencil is mounted on an endless flexible web rotatable in a closed path around the container.

9. An apparatus as claimed in claim 8, wherein a plurality of stencils are mounted on the web.

10. An apparatus as claimed in claim 9, wherein the stencil is mounted on a frame which is reciprocatingly movable with respect to the container in a direction transverse to said slot.

11. An apparatus as claimed in claim 10, wherein the stencil is perforated by apertures of substantially equal size.

12. An apparatus as claimed in claim 11, wherein the slot is downwardly pointing.

13. An apparatus as claimed in claim 12, wherein the stencil is formed from titanium.

14. An apparatus according to claim 7 wherein said means for controlling is a valve for providing atmospheric pressure within said container wherein gravity will force the solder to pass through said at least one slot.

15. An apparatus according to claim 14 wherein said valve is connected to a source of pressurized fluid to urge the solder through said at least one slot.

16. An apparatus according to claim 15 wherein said means for biasing is due to the force of gravity acting on said container.

17. An apparatus according to claim 16 wherein said container includes a heater for maintaining said solder in a melted state.

18. An apparatus according to, claim 17 further comprising a heater for elevating a temperature of said printed circuit board such that said solder will be maintained in a melted state while being deposited thereon.

* * * * *